United States Patent [19]
Glenn et al.

[11] Patent Number: 5,981,314
[45] Date of Patent: *Nov. 9, 1999

[54] NEAR CHIP SIZE INTEGRATED CIRCUIT PACKAGE

[75] Inventors: Thomas P. Glenn, Gilbert, Ariz.; Roy D. Hollaway, Paranaque, Philippines; Anthony E. Panczak, Sunnyvale, Calif.

[73] Assignee: Amkor Technology, Inc., Chandler, Ariz.

[*] Notice: This patent issued on a continued prosecution application filed under 37 CFR 1.53(d), and is subject to the twenty year patent term provisions of 35 U.S.C. 154(a)(2).

[21] Appl. No.: 08/741,797

[22] Filed: Oct. 31, 1996

[51] Int. Cl.⁶ .............................. H01L 21/56; H01L 21/44
[52] U.S. Cl. .................. 438/127; 438/112; 438/123; 438/124; 438/126; 438/613
[58] Field of Search .................. 438/110, 113, 438/114, 125, 126, 462, 464, 458, 112, 123, 124, 127, 613; 257/691, 693, 700, 784, 787; 361/760

[56] References Cited

U.S. PATENT DOCUMENTS

| | | | |
|---|---|---|---|
| 4,508,758 | 4/1985 | Wong | 427/96 |
| 4,530,152 | 7/1985 | Roche et al. | 29/588 |
| 4,890,383 | 1/1990 | Lumbard et al. | 438/27 |
| 5,102,829 | 4/1992 | Cohn | 438/118 |
| 5,126,818 | 6/1992 | Takami et al. | 257/701 |
| 5,173,766 | 12/1992 | Long et al. | 257/687 |
| 5,216,278 | 6/1993 | Lin et al. | 257/688 |
| 5,227,663 | 7/1993 | Patil et al. | 257/718 |
| 5,239,198 | 8/1993 | Lin et al. | 257/693 |
| 5,241,133 | 8/1993 | Mullen, III et al. | 174/52.4 |
| 5,250,470 | 10/1993 | Yamaguchi | 438/113 |
| 5,258,650 | 11/1993 | Polak et al. | 257/788 |
| 5,311,060 | 5/1994 | Rostoker et al. | 257/796 |
| 5,336,931 | 8/1994 | Juskey et al. | 257/787 |
| 5,386,342 | 1/1995 | Rostoker | 257/668 |
| 5,397,746 | 3/1995 | Blish, III | 438/762 |
| 5,436,203 | 7/1995 | Lin | 438/126 |
| 5,468,999 | 11/1995 | Lin et al. | 257/784 |
| 5,473,512 | 12/1995 | Degani et al. | 361/760 |
| 5,474,957 | 12/1995 | Urushima | 438/122 |
| 5,489,059 | 2/1996 | Rostoker et al. | 228/175 |
| 5,578,525 | 11/1996 | Mizukoshi | 438/125 |
| 5,593,926 | 1/1997 | Fujihara | 438/114 |
| 5,596,485 | 1/1997 | Glenn et al. | 361/703 |
| 5,612,513 | 3/1997 | Tuttle et al. | 257/782 |
| 5,639,989 | 6/1997 | Higgins, III | 174/35 MS |
| 5,700,981 | 12/1997 | Tuttle et al. | 257/787 |
| 5,719,440 | 2/1998 | Moden | 257/697 |
| 5,767,447 | 6/1998 | Dudderar et al. | 361/760 |
| 5,776,798 | 7/1998 | Quan et al. | 438/118 |

FOREIGN PATENT DOCUMENTS

| | | |
|---|---|---|
| 55-11361 | 1/1980 | Japan . |
| 58-48442 | 3/1983 | Japan . |
| 62-9639 | 1/1987 | Japan . |

OTHER PUBLICATIONS

Banerji, K., "Development of the Slightly Larger Than IC Carrier (SLICC)", Proceedings of the Feb. 27–Mar. 4, 1994, Technical Program NEPCON WEST '94, pp. 1249–1256.

Levine, B. and Guinther, F., "The Package", *Electronic News* vol. 42, No. 2112 (1996), pp. 1, 32.

*Primary Examiner*—Olik Chaudhuri
*Assistant Examiner*—Alonzo Chambliss
*Attorney, Agent, or Firm*—Skjerven, Morrill, MacPherson, Franklin & Friel LLP

[57] ABSTRACT

A plurality of integrated circuit chip (IC chip) packages are fabricated simultaneously from a single insulating substrate having sections. In each section, an IC chip is attached. Bonding pads on the IC chip are electrically connected to first metallizations on a substrate first surface. The first metallizations, IC chip including bonding pads and first substrate surface are then encapsulated. Interconnection balls or pads are formed at substrate bonding locations on a substrate second surface, the interconnection pads or balls being electrically connected to corresponding first metallizations. The substrate and encapsulant are then cut along the periphery of each section to form the plurality of IC chip packages.

10 Claims, 9 Drawing Sheets

NEAR CHIP SIZE INTEGRATED CIRCUIT PACKAGE

FIELD OF THE INVENTION

The present invention relates to the art of electronic packaging and more particularly to a method of packaging an integrated circuit chip and the resulting structure.

BACKGROUND OF THE INVENTION

As electronic devices become increasingly compact and lightweight, it becomes increasingly desirable to reduce the size of integrated circuit chip (IC chip) packages. In addition to reducing the size of IC chip packages, it is also desirable to simultaneously decrease the manufacturing cost of IC chip packages.

SUMMARY OF THE INVENTION

In accordance with the present invention, a near chip size integrated circuit package, called a CHIPARRAY™ package, is presented. In one embodiment, the package includes an IC chip having a first surface with bonding pads formed thereon. A second surface of the IC chip is mounted to a first surface of an insulating substrate. The first surface of the insulating substrate has first metallizations formed thereon. Each of the bonding pads is electrically connected to a corresponding one of the first metallizations. The IC chip, bonding pads, first metallizations, bond wires and the first surface of the insulating substrate are encapsulated in a layer of encapsulant. The layer of encapsulant has edges which are coincident with edges of the insulating substrate.

Interconnection balls can be formed at bonding locations on a second surface of the insulating substrate. Alternatively, instead of forming interconnection balls, interconnection pads can be formed at the bonding locations. Each of the interconnection balls or interconnection pads are electrically coupled to a corresponding one of the first metallizations.

A package formed in accordance with the present invention is near chip size (i.e. the distance between the edge of the insulating substrate and the IC chip can be as small as 10 mil). Thus, the package is particularly advantageous in applications where limited space for the IC chip package is available such as in disk drive applications.

In accordance with the present invention, a method for fabricating several IC chip packages from a single substrate is also presented. The method includes providing the insulating substrate which has sections with first metallizations formed on a first surface of the insulating substrate. An IC chip is mounted in each of the sections, the IC chips having first surfaces with bonding pads formed thereon. The bonding pads are electrically connected to corresponding ones of the first metallizations with bond wires. The bonding pads, the first surfaces of the IC chips, the first metallizations and the first surface of the insulating substrate are encapsulated in a layer of encapsulant. The layer of encapsulant and the insulating substrate are cut along a periphery of each of the sections to form the plurality of integrated circuit chip packages.

The method can further include forming interconnection balls, or alternatively, interconnection pads at substrate bonding locations on a second surface of the insulating substrate, the interconnection balls or pads being electrically connected to corresponding first metallizations.

Fabricating a plurality of packages simultaneously (in contrast to individually) from a single substrate advantageously reduces handling cost and substrate waste thereby reducing the cost of fabricating each individual package.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

In accordance with the present invention, a near chip size integrated circuit package, called a CHIPARRAY™ package, is presented.

Several elements shown in the following figures are substantially similar. Therefore, similar reference numbers are used to represent similar elements.

Figure 1:
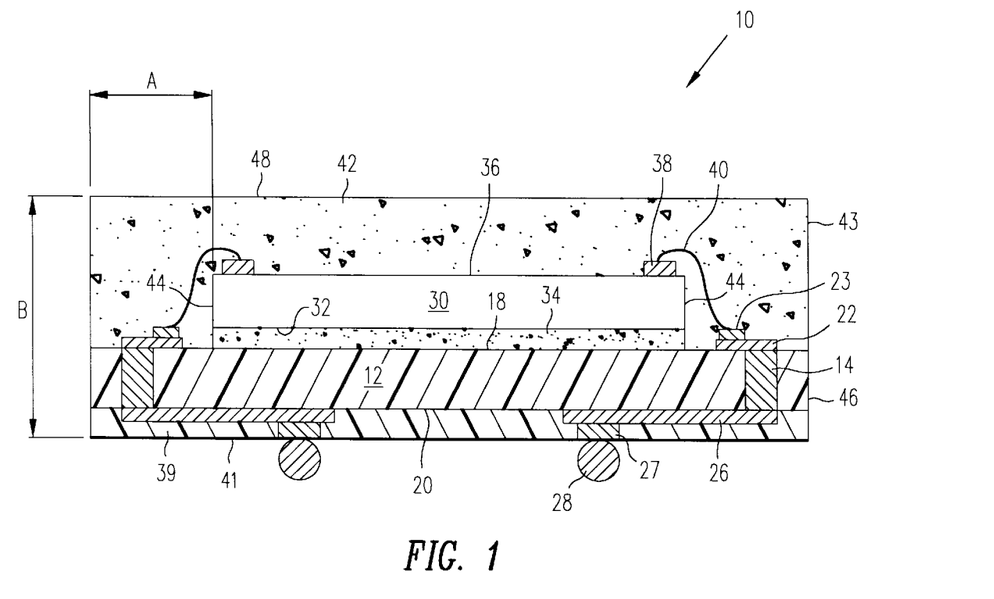
FIG. 1 is a cross-sectional view of a package in accordance with one embodiment of the present invention.

FIG. 1 is a cross-sectional view of a package 10 in accordance with one embodiment of the present invention. Package 10 includes an insulating substrate 12 having electrically conductive through-holes 14. For example, by drilling holes in substrate 12 and then plating the drilled holes with a conductive material such as copper, conductive through-holes 14 are formed. Illustratively, copper is plated to a minimum thickness of 600 micro inches ($\mu$ in).

Substrate 12 is typically a ceramic, a laminate, a passivated metal or a printed circuit board substrate material. Examples of suitable ceramic substrates include 98% alumina or 98% aluminum nitride ceramic substrates available from Sumitomo, Kyocera, NTK and Coors. Examples of suitable laminate substrates include BT (Mitsubishi), FR-4, FR-5, Arlon and GTEK (Matsushita Electric) Laminate Substrates. An example of a suitable passivated metal substrate includes an anodized aluminum substrate available from Alcoa.

Conductive through-holes 14 extend from a first surface 18 to a second surface 20 of substrate 12. Formed on first surface 18 are electrically conductive traces or metallizations 22, typically formed of copper, each of which is electrically connected on a first end to a corresponding conductive through-hole 14. A contact 23 is formed on each metallization 22. Contact 23 is preferably a layer of gold or a multi-layer-metallization with a gold outer layer. In one embodiment, contact 23 is a nickel layer and overlying gold layer with minimum thicknesses of $200\mu$ in and $20\mu$ in, respectively.

Formed on second surface 20 are electrically conductive traces or metallizations 26, typically formed of copper, each electrically connected on a first end to a corresponding conductive through-hole 14. Formed on a second end of each metallization 26 is a contact 27 which is similar to contact 23.

Metallizations 22, 26 can be formed, for example, by masking and etching conductive layers formed on first and second surfaces 18, 20 of substrate 12. Contacts 23, 27 are formed using conventional processes such as electroplating or electro-less plating.

Formed on contacts 27 are interconnection balls 28, each of which is electrically connected to a second end of a metallization 26 by a contact 27. Interconnection balls 28 allow interconnection between package 10 and other electrical components (not shown). Interconnection balls 28 are typically arranged in an array thus forming a ball grid array. In an alternative embodiment, instead of forming interconnection balls 28, contacts 27 are used as interconnection pads. In this embodiment, the typical minimum spacing between adjacent interconnection pads (contacts 27) is 0.30 millimeter (mm) to 1.00 mm.

In other embodiments, the interconnection balls or interconnection pads are not arranged in array but are located near the perimeter of package 10, i.e. are located near edges 46 of substrate 12.

In FIG. 1, a specific electrically conductive pathway between interconnection ball 28 and metallization 22 comprising contact 27, metallization 26 and conductive through-hole 14 is illustrated. However, it is understood that other electrically conductive pathways between interconnection ball 28 (or an interconnection pad) can be formed. For example, substrate 12 can be a multilayer laminate substrate having a plurality of electrically conductive vias electrically connecting conductive traces formed on various layers as is well known to those skilled in the art. Thus, it is to be understood that the electrically conductive pathway formed by contact 27, metallization 26 and conductive through-hole 14 is simply illustrative and not limiting, and that other electrically conductive pathways can be formed between the interconnection balls or interconnection pads and the corresponding metallizations 22.

Mounted to first surface 18 of substrate 12 is an integrated circuit (IC) chip 30. In particular, a first surface 32 of IC chip 30 is mounted to first surface 18 of substrate 12 typically by a layer of epoxy adhesive 34. Formed on a second surface 36, opposite first surface 32, of IC chip 30 are bonding pads 38. Bonding pads 38 are electrically connected to the internal electronic components of IC chip 30. Each bonding pad 38 is electrically connected to a corresponding metallization 22 by a bond wire 40 which is bonded to contact 23. Thus, an electrically conductive pathway is formed from each interconnection ball 28 to the corresponding bonding pad 38.

Second surface 36 of IC chip 30, bonding pads 38, bond wires 40, the exposed first surface 18 of substrate 12, contacts 23 and metallizations 22 are encapsulated in a layer of encapsulant 42. As shown in FIG. 1, edges 43 of layer of encapsulant 42 are coincident with edges 46 of substrate 12. Formed over portions of second surface 20 and metallizations 26 is an electrically insulating solder mask 39 which does not cover contacts 27 or interconnection balls 28. Solder mask 39 is applied and patterned using conventional techniques.

Figure 2:
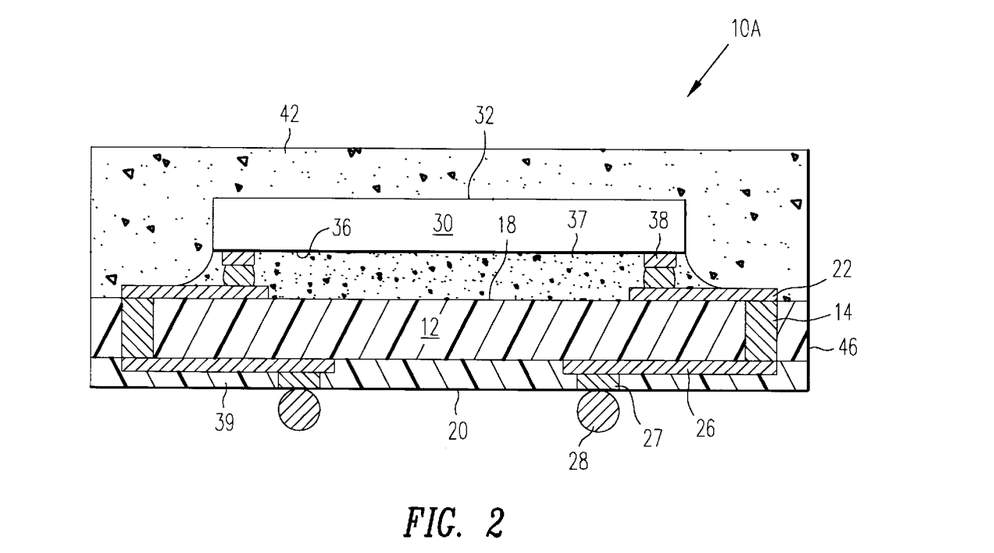
FIG. 2 is a cross-sectional view of a package in which a flip-chip interconnection is formed in accordance with an alternative embodiment of the present invention.

FIG. 2 is a cross-sectional view of a package 10A in which a flip-chip interconnection is formed in accordance with an alternative embodiment of the present invention. As shown in FIG. 2, IC chip 30 is mounted to substrate 12 using a flip-chip interconnection. More particularly, in this embodiment, second surface 36 of IC chip 30 is placed adjacent first surface 18 of substrate 12 and bonding pads 38 are electrically connected to metallizations 22 directly, for example by solder. (In FIG. 2, bonding pads 38 are bonded directly to metallizations 22 although, alternatively, bonding pads 38 can be bonded to contacts 23 (FIG. 1) on metallization 22.) Accordingly, bond wires 40 of FIG. 1 are unnecessary and therefore eliminated. An underfill material 37 is applied to fill the space between IC chip 30 and substrate 12 which also encapsulates the flip chip interconnection with bonding pads 38. In all other aspects, package 10A is substantially similar to package 10 in FIG. 1.

Referring back to FIG. 1, package 10 is a near chip size integrated circuit package, i.e. the distance A between any edge 44 of IC chip 30 and any edge 46 of substrate 12 can be as small as 10 mil (1 mil=1/1000 inch) and typically is between 40 to 60 mil and in one embodiment is 30 mil. Further, the distance B between an upper surface 48 of layer of encapsulant 42 and lower surface 41 of solder mask 39 is generally less than 60 mil and typically is between 40–60 mil and in particular depends in part upon the thickness of substrate 12, the thickness of IC chip 30 and the thickness of layer of encapsulant 42 over IC chip 30. For example, substrate 12 has a thickness of 0.36 millimeter (mm) or 0.56 mm, IC chip 30 has a thickness of 0.010 in. to 0.013 in., preferably 0.011 in. and layer of encapsulant 42 over IC chip 30 has a thickness of 0.011 in. Since package 10 is near chip size, package 10 is particularly advantageous in applications where limited space for the IC chip package is available such as in disk drive applications.

Figure 3A:
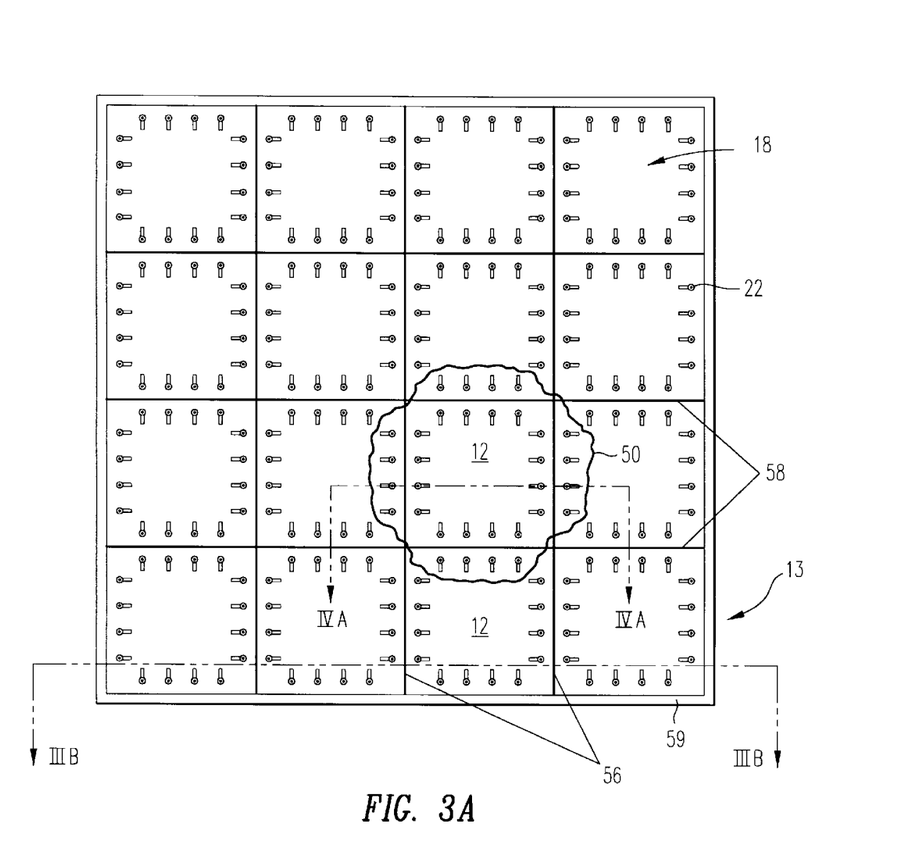
FIG. 3A is a top plan view of a substrate in accordance with the present invention.

FIG. 3A is an enlarged top plan view of a substrate 13 in accordance with the present invention. In FIG. 3A, a plurality of lines 56 oriented in the vertical direction, as well as a plurality of lines 58 oriented in the horizontal direction are illustrated. Lines 56 and 58 are included in the following figures to clarify the sections 12 where each individual package is to be formed, the formation of which is described in detail below. (For clarity, in FIG. 3A only two sections 12 are labeled). As shown in FIG. 3A, the periphery of each section 12 is defined by lines 56, 58. However, in an alternative embodiment, instead of lines 56, 58, alignment marks are provided for aligning substrate 13 in subsequent processing step such as those described below. Substrate 13 is preferably a square or rectangular substrate, for example is a 2.0 in.×2.0 in. (5.1 cm×5.1 cm), a 3.0 in.×3.0 in. (7.6 cm×7.6 cm) or a 4.0 in.×4.0 in. (10.2 cm×10.2 cm) square substrate.

As shown in FIG. 3A, a dam 59 is formed on a first surface 18 of substrate 13 around the perimeter of substrate 13. Dam 59 encloses sections 12, yet does not extend into any of the section 12.

Figure 3B:
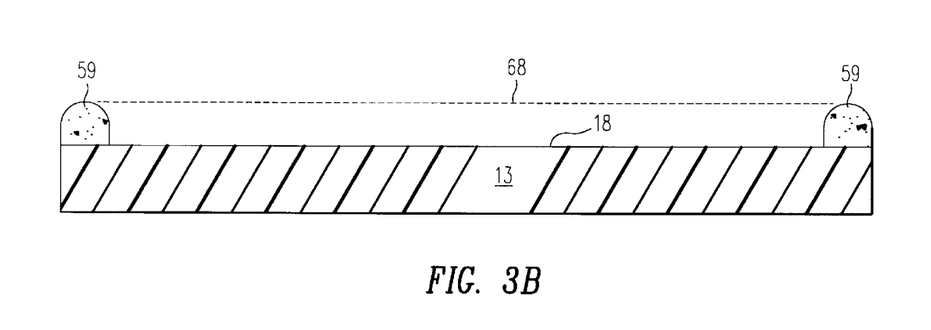
FIG. 3B is a cross-sectional view along the line IIIB—IIIB of FIG. 3A of the substrate.

FIG. 3B is a cross-sectional view along the line IIIB—IIIB of FIG. 3A of substrate 13. In FIG. 3B, metallizations, conductive through-holes and other features are not illustrated for clarity. As shown in FIG. 3B, dam 59 extends from first surface 18 to a predetermined height indicated by dashed line 68 above first surface 18 thereby defining a pocket which can be filled with encapsulant as described in more detail below.

Dam 59 can be any material suitable for preventing encapsulant from flowing off of substrate 13. In one embodiment, dam 59 is formed by applying encapsulant such as Dexter Hysol 4450 or 4451 or its equivalent.

Referring back to FIG. 3A, each section 12 of substrate 13 has a plurality of metallizations 22 formed on first surface 18 of substrate 13, a plurality of contacts 23 (not shown) formed on metallizations 22 and a plurality of conductive through-holes 14 (not shown) formed through substrate 13. Metallizations 22 are formed using conventional techniques such as by forming a conductive layer on first surface 18 and then by masking and etching the conductive layer. Conductive through-holes 14 are also formed using conventional techniques such as by drilling through-holes in substrate 13 and then plating the drilled through-holes with a conductive metal such as copper.

FIGS. 4 to 8 illustrate various stages in the formation of a package in accordance with the present invention. Although the formation of a single package is described for clarity, it should be understood that a plurality of packages are formed from a single substrate 13 simultaneously, one package being formed from each section 12 of substrate 13.

Figure 4A:
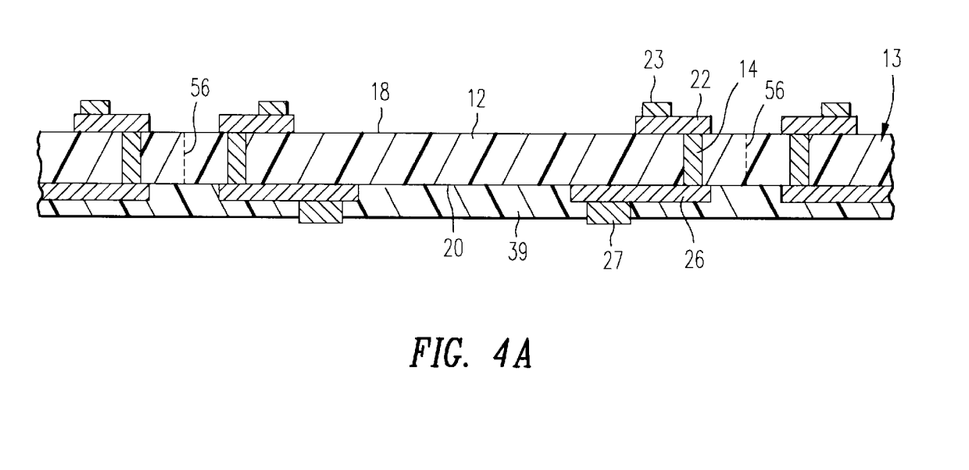
FIGS. 4A, 4B and 4C are cross-sectional (taken along the line IVA—IVA of FIG. 3A), top plan and bottom plan views, respectively, of a region of the substrate of FIG. 3A.

FIG. 4A is a cross-sectional view of substrate 13 and in particular of one of the sections 12 along the line IVA—IVA of FIG. 3A in accordance with one embodiment of the present invention. Contacts 23, metallizations 22, conductive through-holes 14, metallizations 26 and contacts 27 are illustrated in FIG. 4A. Also illustrated is solder mask 39.

Figure 4B:
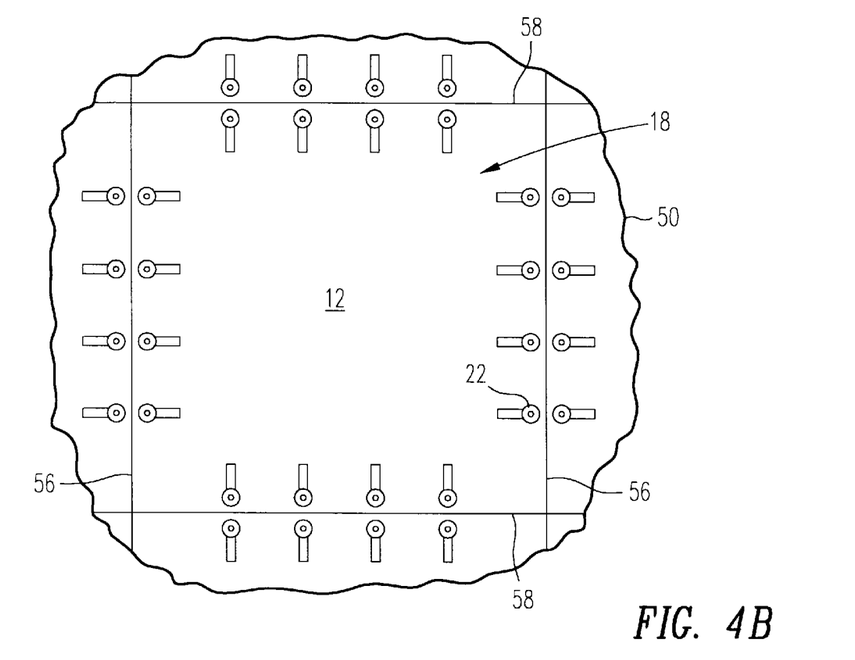

FIG. 4B is a top plan view of a region 50 of substrate 13 from FIG. 3A and in particular of one of the sections 12 illustrating metallizations 22 formed on first surface 18 of substrate 13. Contacts 23 are not illustrated in FIG. 4B for purposes of clarity. In one embodiment, metallizations 22 are a minimum of 0.017 in. long and a minimum of 0.005 in. wide although metallizations 22 with other dimensions can be used.

Figure 4C:
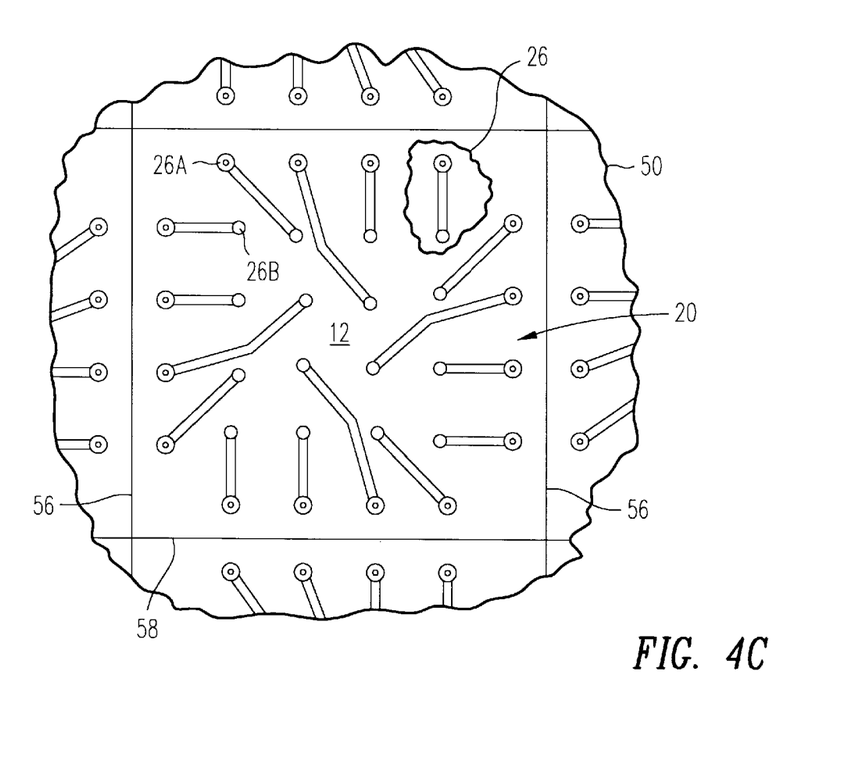

FIG. 4C is a bottom plan view of region 50 of substrate 13 from FIG. 3A illustrating a plurality of metallizations 26 formed on second surface 20 of substrate 13. In FIG. 4C, solder mask 39 is not illustrated for purposes of clarity.

As shown in FIG. 4C, each metallization 26 has a first end 26A which is electrically connected to a conductive through-hole 14 and a second end 26B. Metallizations 26 are formed using conventional techniques such as by forming a conductive layer on second surface 20 and then by masking and etching the conductive layer. Contacts 27 (not shown in FIG. 4C for purposes of clarity) are formed on metallizations 26 at second ends 26B.

Figure 5A:
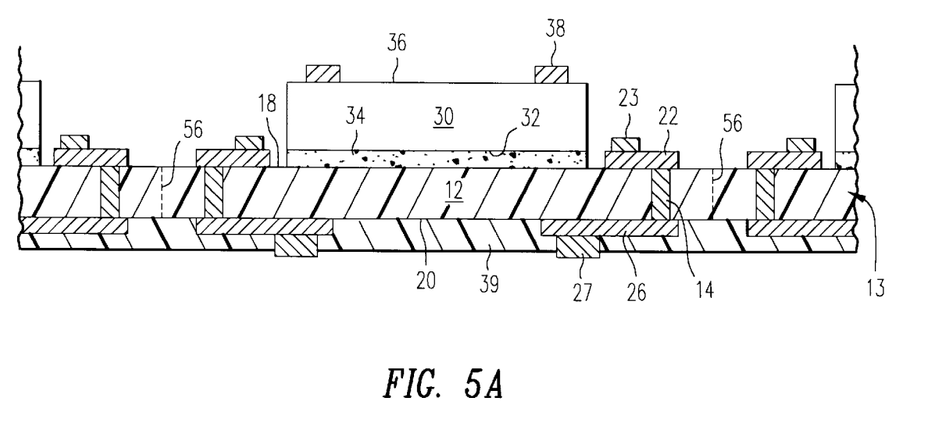
FIGS. 5A, 6A, 7 and 5B, 6B are cross-sectional and top plan views, respectively, of a package at various stages during fabrication in accordance with the present invention.
Figure 5B:
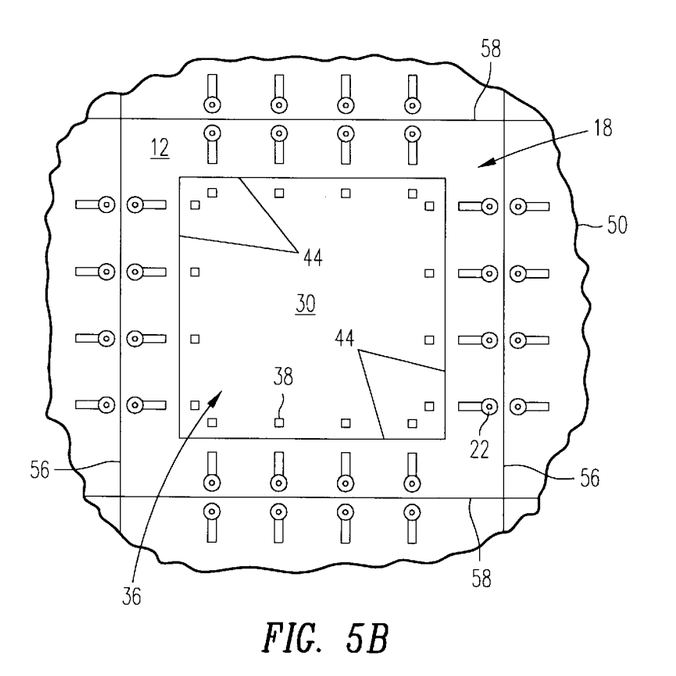

FIGS. 5A and 5B are cross-sectional and top plan views, respectively, of package 10 further along in processing. As shown in FIG. 5A, the first surface 32 of IC chip 30 is mounted to first surface 18 of substrate 13 by a layer of adhesive 34. Adhesive 34 is preferably epoxy adhesive such as Ablestick 965-IL or 8360, QMI 595 or an equivalent.

As shown in FIG. 5B, IC chip 30 is mounted to section 12 in a location central to metallizations 22 and in one embodiment the distance between the edges 44 of IC chip 30 and metallizations 22 is approximately 10 mils. Also shown are bonding pads 38 located on a second surface 36 of IC chip 30. In FIG. 5B, metallizations 22 are illustrated adjacent all four edges 44 of IC chip 30. However, in an alternative embodiment, metallizations 22 are not formed along one or more edges 44. In this alternative embodiment, the distance between an edge 44 not having adjacent metallizations 22 and line 56 (or 58) can be reduced as compared to the distance between an edge 44 having adjacent metallization 22 and line 56 (or 58). For example, the distance is reduced to 15 mils.

Figure 6A:
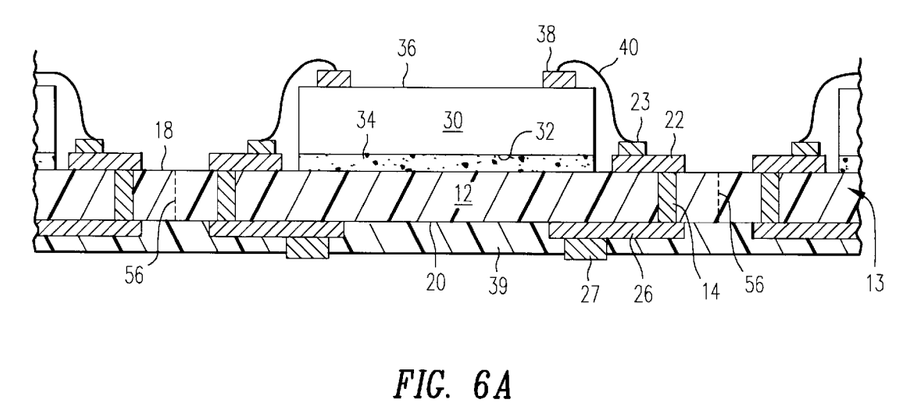
Figure 6B:
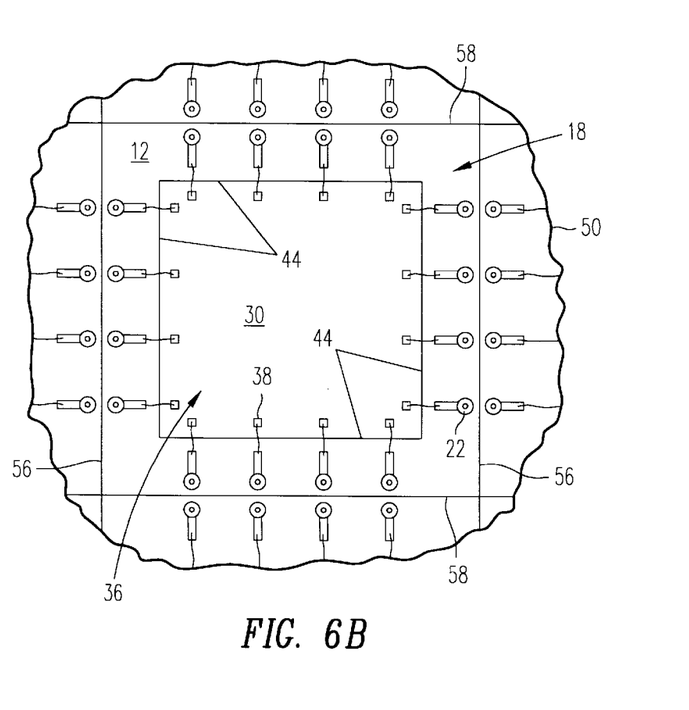

FIGS. 6A and 6B are cross-sectional and top plan views, respectively, of package 10 further along in processing. As shown in FIGS. 6A and 6B, bonding pads 38 are electrically connected to corresponding contacts 23 by bond wires 40, made of gold or aluminum for example, using conventional wire bonding techniques. Examples of suitable wire bonding techniques include gold ultrasonic, aluminum ultrasonic and gold thermocompression techniques. By using gold plated contacts 23, a better bond is formed between metallization 22 and bond wire 40. However, in an alternative embodiment, contacts 23 are not formed and bond wire 40 is directly bonded to the corresponding metallization 22.

In an alternative embodiment (not shown) instead of mounting first surface 32 of IC chip 30 to first surface 18 of substrate 13 and electrically correcting bonding pads 38 to metallizations 22 using bond wires 40 as illustrated in FIGS. 5A, 5B, 6A, 6B, IC chip 30 is mounted to substrate 13 using a flip chip interconnection. In this embodiment (not shown), second surface 36 of IC chip 30 is placed adjacent first surface 18 of substrate 13 and bonding pads 38 are electrically connected to metallizations 22 directly, for example by solder. An underfill material 37 (See FIG. 2) is applied to fill the space between IC chip 30 and substrate 12 and also to encapsulate the flip chip interconnection between bonding pads 38 and metallizations 22. For example, the underfill material is Dexter Hysol 4511, Alpha Metals EL18, Hokuriku XF8413 or an equivalent. In all other aspects, processing is identical to processing used to fabricate package 10 in FIG. 1 and results in package 10A in FIG. 2.

Figure 7:
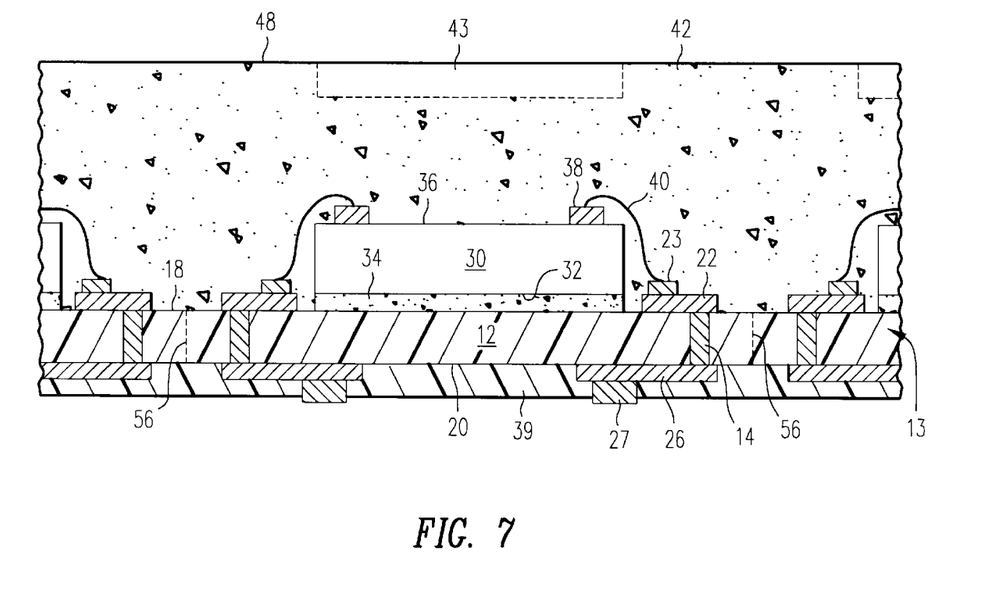

FIG. 7 is a cross-sectional view of package 10 further along in processing. As shown in FIG. 7, a layer of encapsulant 42 is applied over the entire assembly. In particular, layer of encapsulant 42 covers IC chip 30 including bonding pads 38, bond wires 40, contacts 23, metallizations 22 and the remaining exposed first surface 18 of substrate 13. Layer of encapsulant 42 is formed of an electrically insulating encapsulant and preferably is Dexter Hysol 4450 or 4451 or an equivalent. Layer of encapsulant 42 can be laser marked for product identification using conventional laser marking techniques.

As illustrated by the dashed rectangle in FIG. 7, a heat slug 43 can be embedded into layer of encapsulant 42 to improve the heat transfer from IC chip 30 to the outside environment. Heat slug 43 is typically a copper heat slug and is simply pressed into layer of encapsulant 42 as the encapsulant solidifies. Heat slug 43 is not illustrated in subsequent processing steps or in FIGS. 1 and 2 although it is understood that a heat slug can be incorporated into the embodiments illustrated by these figures.

Referring back to FIGS. 3A and 3B, and in particular to FIG. 3B, layer of encapsulant 42 is applied by filling the pocket defined by dam 59 with encapsulant. Dam 59 prevents layer of encapsulant 42 from flowing off of first surface 18 of substrate 13. Preferably, Dam 59 has a height indicated by dashed line 68 above first surface 18 greater than or equal to the height of upper surface 48 of layer of encapsulant 42 (FIG. 7) above first surface 18.

Figure 8A:
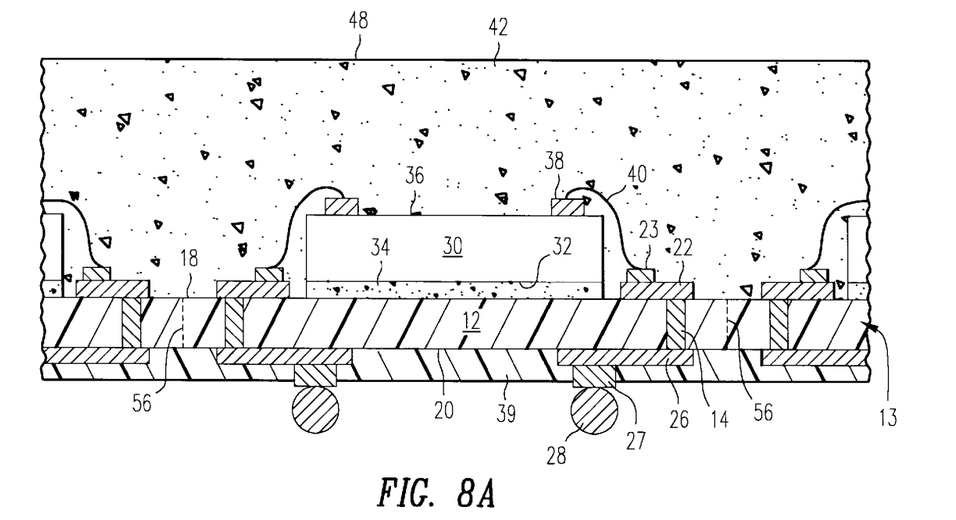
FIGS. 8A and 8B are cross-sectional and bottom plan views, respectively, of a package further along in fabrication in accordance with the present invention.
Figure 8B:
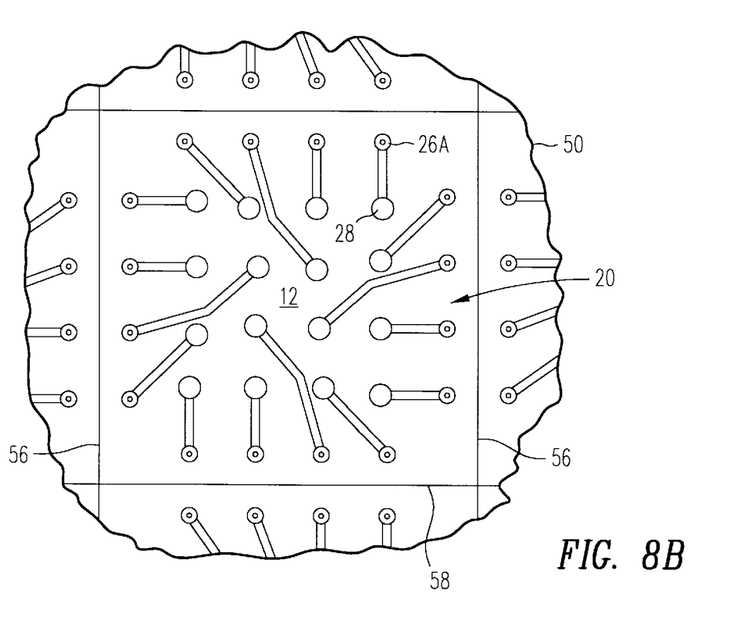

FIGS. 8A and 8B are cross-sectional and bottom plan views, respectively, of package 10 further along in processing. In FIG. 8B, solder mask 39 is not shown for purposes of clarity. As shown in FIG. 8A, interconnection balls 28, typically eutectic solder balls, preferably made of 63% tin and 37% lead, are attached to contacts 27 using conventional techniques.

As shown in FIG. 8B, interconnection balls 28 are arranged in an array thus forming a ball grid array. Although the formation of a package including interconnection balls 28 is described, in alternative embodiments, contacts 27 form interconnection pads for electrical interconnection with other components and interconnection balls 28 are not formed. Further, the interconnection balls or pads can be arranged adjacent the perimeter of section 12, i.e. can be arranged near lines 56 and/or lines 58, instead of being arranged in an array fashion as in FIG. 8B.

In an alternative embodiment, the interconnection balls or the interconnection pads are formed at substrate bonding locations on second surface 20 of substrate 12. As described in reference to FIG. 1, the interconnection balls or interconnection pads formed at the substrate bonding locations are electrically coupled to metallizations 22 by electrically conductive traces and/or vias of substrate 12. Thus, in this alternative embodiment, metallizations 26 may not be present on second surface 20 of substrate 12, for example when the substrate bonding locations are at the end of electrically conductive vias.

Referring again to FIG. 8A, substrate 13 and layer of encapsulant 42 are then cut, typically by sawing, along lines 56, 58 (best seen in FIG. 3A) to form package 10 (FIG. 1). A blue wafer mounting tape (available from Nitto for example) conventionally used to hold a wafer while it is cut into individual IC chips can be used to hold substrate 13 while substrate 13 and layer of encapsulant 42 are cut to form package 10 as those skilled in the art will understand. Cutting substrate 13 simultaneously with layer of encapsulant 42 forms a package 10 with edges 43 (see FIG. 1) of layer of encapsulant 42 coincident with edges 46 of substrate 12. It is understood that in this embodiment substrate 12 (FIG. 1) in each package 10 is a section of the larger substrate 13 (FIG. 3A).

After substrate 13 and layer of encapsulant 42 are cut, yet while the individual packages 10 are still mounted on the blue wafer mounting tape, each package 10 is tested and bad packages are marked. (Substrate 13 is mounted onto the blue wafer mounting tape with layer of encapsulant 42 facing down onto the blue wafer mounting tape and interconnection balls 28 facing up.) Testing involves contacting interconnection balls 28 (which are conveniently facing upwards) with test probes or contacts as is known to those skilled in the art. Testing the plurality of packages together while the packages are still mounted on the blue wafer mounting tape is faster and advantageously reduces testing cost as compared to placing each package into a tester individually and then testing the package.

For simplicity only a few bonding pads 38 are illustrated on IC chip 30 in the above figures. However, it is understood that typically a large number of bonding pads 38 with corresponding leads, i.e. with corresponding electrically conductive pathways formed by bond wires 40, contacts 23, metallizations 22, conductive through-holes 14, metallizations 26, contacts 27 and interconnection balls 28, are formed depending upon the particular input/output (I/O) requirements of the device. Generally, the number of bonding pads 38 with corresponding leads is less than 300 and typically is less than 64.

Referring again to FIG. 3A, fabricating a plurality of packages simultaneously, in contrast to individually, from a single substrate 13 advantageously reduces handling costs thereby reducing the cost of fabricating each individual package. Further, by fabricating a plurality of packages simultaneously from a single substrate 13, waste or trimming of substrate 13 is reduced or essentially eliminated thereby further reducing the cost of fabricating each individual package. (In contrast, when individual integrated circuit packages are fabricated, the substrate is slightly oversized to allow handling of the substrate, and the excess substrate is trimmed in subsequent fabrication steps.)

The cost of fabricating each individual package can be further reduced by properly sizing substrate 13. In particular, by using a rectangular substrate 13 which is sized to correspond with the number of packages being fabricated, waste of substrate 13 is minimized or essentially eliminated. For example, if IC chip 30 has an area equal to 0.04 $in^2$ (200 mil×200 mil) and dimension A (FIG. 1) is 25 mil, then substrate 13 should have lateral and vertical dimensions equal to multiples of 250 mil depending upon the number of packages to be formed from substrate 13 (200 mil for each IC chip 30 plus 2×25 mil or 50 mil for dimension A on both sides of each IC chip 30). Thus, in this example, for a 2"×2" substrate 13, 64 packages can be formed simultaneously. However, it is understood that substrates with other dimensions and shapes can be used, for example a circular substrate can be used. Further, it is understood that the number of packages fabricated per substrate and the amount of substrate waste or trimmings generate from a substrate are determined by the substrate size, the size of the IC chip and the dimension A.

In another embodiment, the size of package 10 (FIG. 1) is determined by the leadcount, i.e. by the number of interconnection balls 28 which must be formed. For this embodiment, relevant parameters for a given interconnection ball diameter are presented in Table 1.

TABLE 1

| Ball diameter (inches) | Minimum substrate edge to ball distance (inches) | Minimum Ball Pitch (mm) | Minimum Ball Height (inches) |
| --- | --- | --- | --- |
| 0.012 | 0.015 | 0.50 | 0.007 |
| 0.015 | 0.017 | 0.50 | 0.010 |
| 0.020 | 0.019 | 0.75 | 0.013 |
| 0.025 | 0.020 | 1.00 | 0.015 |
| 0.030 | 0.023 | 1.27 | 0.019 |

In Table 1, minimum substrate edge to ball distance refers to the minimum distance between any interconnection balls 28 (FIG. 1) and edge 46 of substrate 12. Minimum ball pitch is the minimum spacing between interconnection balls. Thus, for a given number of interconnection balls having a given ball diameter, the size of substrate 12 needed to accommodate the interconnection balls can be readily calculated by knowing the minimum ball pitch and minimum substrate edge to ball distance as provided in Table 1.

The minimum ball height in Table 1 refers to the additional thickness added by interconnection balls 28 to dimension B (FIG. 1) after interconnection balls 28 have been reflowed (interconnection balls 28 are reflowed to interconnect package 10 to other electrical components such as to a printed circuit board).

FIGS. 9, 10, 11, 12 and 13 are top plan views of various features of a substrate in accordance with this embodiment of the present invention.

Figure 9:
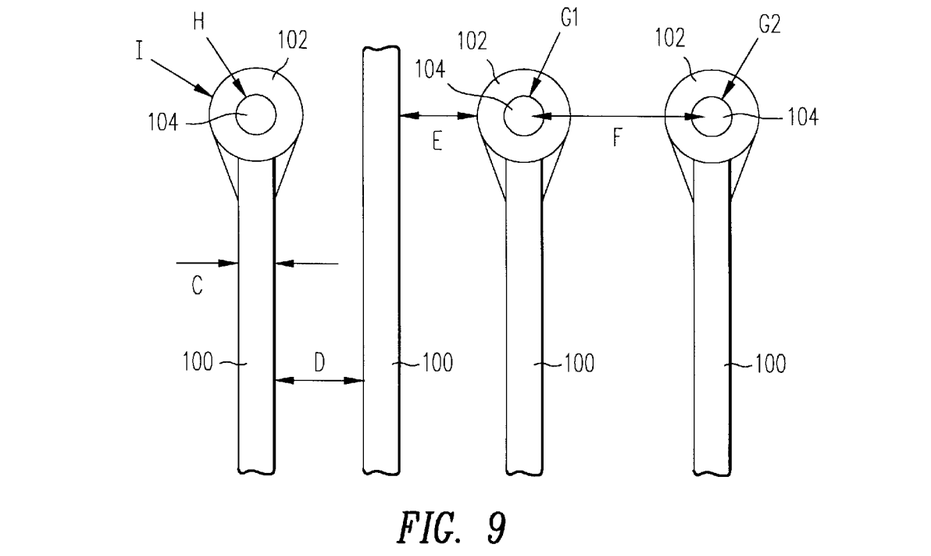
FIGS. 9, 10, 11, 12 and 13 are top plan views of various features of a substrate in accordance with another embodiment of the present invention.

FIG. 9 illustrates conductive lines 100 and via lands 102 including vias 104. In this embodiment, the minimum width C of lines 100 is 0.003 in. The minimum spacing D between lines 100 is 0.004 in. The minimum spacing E between a line 100 and a via land 102 is 0.0035 in. The minimum via center to via center spacing F is 0.5 G1 plus 0.5 G2 plus 0.010 in. ((½)G1+(½) G2+0.010 in.) where G1 and G2 are the diameters of the adjacent vias 104. The minimum diameter H of any via 104 is 0.010 in. for substrates less than 0.024 in. thick and 0.012 in. for substrates thicker than 0.024 in. The minimum diameter I of any via land 102 is diameter H of via 104 plus 0.006 in. (H+0.006 in.).

Figure 10:
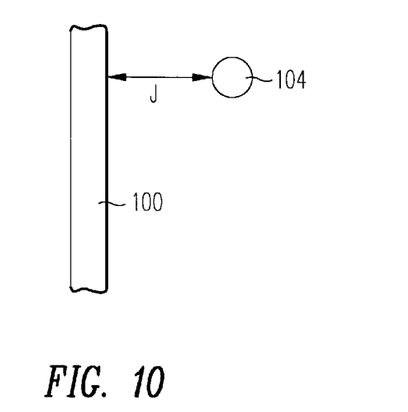

FIG. 10 illustrates the minimum spacing J between a line 100 on an internal layer of a multilayered substrate and a via 104 passing through the internal layer in accordance with this embodiment of the invention. The minimum spacing J is 0.0035 in.

Figure 11:
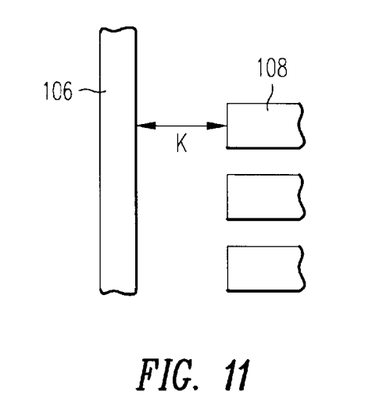

FIG. 11 illustrates the minimum spacing K between a metallization 106 covered by a solder mask (not shown) and a metallization 108 not covered by a solder mask. The minimum spacing K is 0.007 in. Note that the minimum spacing K is greater than the minimum spacing D between lines 100 (FIG. 9) since the minimum spacing K must include tolerances associated with the placement of the solder mask.

Figure 12:
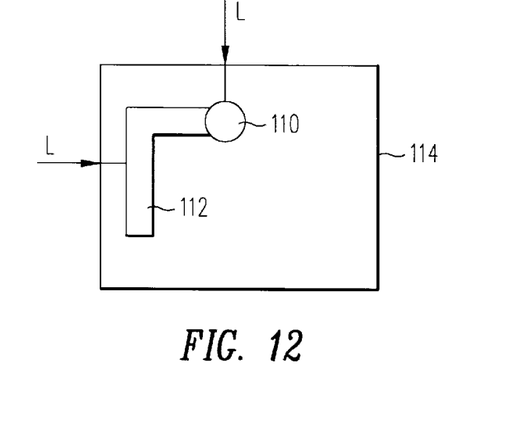

FIG. 12 illustrates the minimum spacing L between any via 110, metallization or other feature 112 and any edge 114 of the substrate. Edge 114 refers to the edge of a substrate from which a plurality of CHIPARRAYs™ are fabricated. (For example, one of the four edges of substrate 13 in FIG. 3A, i.e. one of the edges of substrate 13 adjacent dam 59.) The minimum spacing L is 0.008 in.

Figure 13:
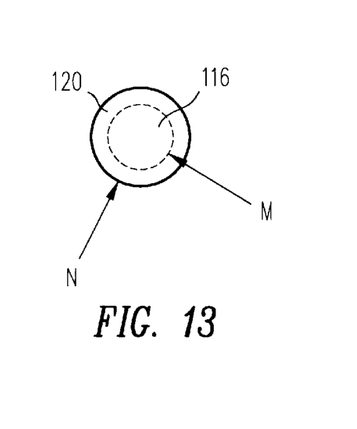

FIG. 13 illustrates the minimum diameter M of a solder mask defined opening 116 and the minimum diameter N of a contact 120 upon which an interconnection ball will be formed for a solder mask defined contact. The minimum diameter M is 0.006 in. The minimum diameter N is greater than the minimum diameter M. However, in an alternative embodiment, non-solder mask defined contacts are used. In this alternative embodiment, 116 is the contact, 120 is the solder mask defined opening, diameter M is the minimum diameter of the contact 116 and diameter N is the minimum diameter of the solder mask defined opening 120. In either embodiment, the interconnection ball formed on the contact will be confined to the diameter M.

Although the present invention has been described with reference to preferred embodiments, persons skilled in the art will recognize that changes may be made in form and detail without departing from the spirit and scope of the invention. For example, referring to FIG. 1, contacts 23 and/or contacts 27 are optional and do not have to be formed. Further, a solder mask layer can be formed over selective portions of first surface 18 of substrate 12. Also, solder mask layer 39 on second surface 20 of substrate 12 does not have to be formed. Thus, the invention is limited only by the following claims.

We claim:

1. A method of forming a plurality of integrated circuit chip packages from an insulating substrate, said method comprising the steps of:

providing said insulating substrate which has sections, said sections having first metallizations formed on a first surface of said insulating substrate;

mounting an integrated circuit chip in each of said sections, said integrated circuit chips having first surfaces with bonding pads formed thereon;

electrically connecting said bonding pads to corresponding ones of said first metallizations with bond wires;

forming a dam on said first surface of said insulating substrate around a perimeter of said insulating substrate;

encapsulating said bonding pads, said first surfaces of said integrated circuit chips, said first metallizations and said first surface of said insulating substrate with a layer of encapsulant by filling a pocket defined by said dam with an electrically insulating encapsulant; and cutting said layer of encapsulant and said insulating substrate along a periphery of each of said sections to form said plurality of integrated circuit chip packages.

2. The method of claim 1 wherein said sections have second metallizations formed on a second surface of said insulating substrate, wherein said sections have conductive through-holes extending from said first surface of said insulating substrate to said second surface of said insulating substrate and wherein said conductive through-holes are electrically connected to corresponding ones of said first metallizations and to corresponding ones of said second metallizations.

3. The method of claim 2 wherein said second metallizations are connected on first ends to said corresponding conductive through-holes, said method further comprising the step of forming interconnection balls at second ends of said second metallizations.

4. The method of claim 2 wherein said second metallizations are connected on first ends to said corresponding conductive through-holes, said method further comprising the step of forming interconnection pads at second ends of said second metallizations.

5. The method of claim 3 wherein said step of mounting further comprises mounting second surfaces of said integrated circuit chips, opposite said first surfaces of said integrated circuit chips, to said first surface of said insulating substrate with adhesive.

6. The method of claim 3 further comprising the step of forming interconnection balls at substrate bonding locations on a second surface of said insulating substrate, opposite said first surface of said insulating substrate, wherein said interconnection balls are electrically connected to corresponding ones of said first metallizations.

7. The method of claim 1 further comprising the step of forming interconnection pads at substrate bonding locations on a second surface of said insulating substrate, opposite said first surface of said insulating substrate, wherein said interconnection pads are electrically connected to corresponding ones of said first metallizations.

8. The method of claim 1 further comprising the step of embedding a heat slug into said layer of encapsulant over each of said sections such that each of said heat slugs is contained within said layer of encapsulant.

9. A method of packaging an integrated circuit chip having a first surface with bonding pads formed thereon, said method comprising the steps of:

mounting a second surface of said integrated circuit chip to a first surface of an insulating substrate having sections, said integrated circuit chip being mounted to said insulating substrate in one of said sections;

electrically connecting each of said bonding pads to corresponding first metallizations formed on said first surface of said insulating substrate with bond wires;

forming a dam on said first surface of said insulating substrate around a perimeter of said insulating substrate;

encapsulating said bonding pads, said first surface of said integrated circuit chip, said bond wires and said first surface of said insulating substrate in a layer of encapsulant by filling a pocket defined by said dam with an electrically insulating encapsulant;

forming interconnection balls at bonding locations on a second surface of said insulating substrate, wherein each of said interconnection balls is electrically connected to a corresponding one of said first metallizations; and cutting said insulating substrate and said layer of encapsulant along a periphery of said one section in which said integrated circuit is mounted.

10. A method of forming a plurality of integrated circuit chip packages from an insulating substrate, said method comprising the steps of:

providing said insulating substrate which has sections, said sections having first metallizations formed on a first surface of said insulating substrate;

placing a first surface of an integrated circuit chip adjacent said first surface of said insulating substrate in each of said sections, said first surfaces of said integrated circuit chips having bonding pads formed thereon;

forming flip chip connections between said bonding pads and corresponding ones of said first metallizations;

applying an underfill material between said integrated circuit chips and said substrate to encapsulate said flip chip connections;

forming a dam on said first surface of said insulating substrate around a perimeter of said insulating substrate;

encapsulating a second surface of said integrated circuit chips and said first surface of said insulating substrate with a layer of encapsulant by filling a pocket defined by said dam with an encapsulant; and cutting said layer of encapsulant and said insulating substrate along a periphery of each of said sections to form said plurality of integrated circuit chip packages.

* * * * *